United States Patent [19]

Gordon et al.

[11] Patent Number: 4,891,302

[45] Date of Patent: Jan. 2, 1990

[54] METHOD OF PREPARING A CONTOURED PLATE

[76] Inventors: Douglas C. Gordon, R.R. 1, Kinburn, Ontario, Canada, K0A 2H0; David W. Rapkins, 6283 Steamer Lane, Gloucester, Ontario, Canada, K1C 1C8

[21] Appl. No.: 242,226

[22] Filed: Sep. 9, 1988

Related U.S. Application Data

[63] Continuation-in-part of Ser. No. 46,568, May 6, 1987, abandoned.

[51] Int. Cl.⁴ .............................................. G03F 7/02
[52] U.S. Cl. ...................... 430/300; 430/307; 430/309; 430/394; 430/396; 101/463.1; 101/466
[58] Field of Search ............... 101/456, 466, 463.1; 430/6, 307, 309, 394, 396, 300, 306

[56] References Cited

U.S. PATENT DOCUMENTS

| | | | |
|---|---|---|---|
| 1,319,076 | 10/1919 | Hermann | 101/150 |
| 1,817,435 | 8/1931 | Freuder | 101/170 |
| 2,596,115 | 5/1952 | Austin | 101/170 |
| 3,154,415 | 12/1964 | Kaulen | 430/307 |
| 3,210,187 | 11/1965 | Thommes | 430/271 |
| 3,259,499 | 7/1966 | Thommes | 430/273 |
| 3,310,403 | 3/1967 | Bryan | 101/170 |
| 3,599,153 | 8/1971 | Lewis et al. | 340/149 |
| 3,741,835 | 6/1973 | Giori | 101/170 |
| 3,770,435 | 11/1973 | Volkert et al. | 96/45 |
| 3,859,091 | 1/1975 | Wessells et al. | 430/309 |
| 3,980,018 | 9/1976 | Ichikawa | 101/170 |
| 4,033,059 | 7/1977 | Hutton et al. | 101/150 |
| 4,036,130 | 7/1977 | Giori | 101/170 |
| 4,101,324 | 7/1978 | Mizuno et al. | 430/494 |
| 4,158,567 | 6/1979 | Homma et al. | 430/307 |
| 4,323,636 | 4/1982 | Chen | 430/281 |
| 4,369,246 | 1/1983 | Chen et al. | 430/281 |
| 4,478,931 | 10/1984 | Fickes et al. | 430/309 |
| 4,668,607 | 5/1987 | Wojcik | 430/281 |

FOREIGN PATENT DOCUMENTS

| | | | |
|---|---|---|---|
| 2906686 | 9/1979 | Fed. Rep. of Germany | 430/307 |
| 2464826 | 4/1981 | France | 101/170 |
| 55-21340 | 6/1980 | Japan . | |
| 225015 | 11/1924 | United Kingdom | 101/170 |

OTHER PUBLICATIONS

Beacham, London Patent Specification No. 1304835, Jan. 3, 1969.
"Miraclon" Brochure, Tokyo OHKA Kogyo C., Ltd.

Primary Examiner—José G. Dees
Assistant Examiner—Donald J. Loney

[57] ABSTRACT

Method of preparing a contoured plate by selectively hardening a photopolymer plate in a zone which is adjacent the lower surface of the plate and increases continuously in thickness from one portion of the plate to another by a first exposure of the upper surface of the plate to a quantity of light energy which increases continuously per unit area of the surface from said one portion of the plate to the other. Discrete portions of the upper surface of the plate are masked in the portions on which it is desired to form a recessed design, and the non-masked portions of the plate are hardened by a second exposure of its upper surface to light energy, so that the masked portions remain unhardened from their upper surface to the upper region of said hardened zone. The unhardened portions are removed to provide a recessed design in the upper surface of the plate. The design varies continuously in depth independently of the width of the design.

20 Claims, 4 Drawing Sheets

METHOD OF PREPARING A CONTOURED PLATE

This application is a continuation-in-part application Ser. No. 07/046,568 filed May 6, 1987.

In intaglio printing, where the grooves or other depressed portions of the intaglio plate or basso are of constant width, they are usually of constant depth. Traditionally, the grooves were hand engraved, but they are more commonly etched. The depth of the etched depression can be increased by etching for a longer time, but this increases the width of the etched area, because the etchant undercuts the resist. Etched depressions of constant width and varying depth can be produced by repeated or stepwise etchings using progressively varying patterns of resist, but this procedure is time-consuming, complex and relatively expensive, and produces a stepped rather than continuous variation in depth.

The present invention relates to a process for preparing an intaglio or other contoured plate whereby intaglio or other contoured designs can be produced with depth which varies continuously independently of the width of the depressions. The printed impressions obtained from printing processes making use of the intaglio plates prepared according to the invention have a distinctive appearance which is difficult to reproduce using conventional reproduction techniques. Moreover, since the height of the inked impression varies continuously over the surface of the substrate, the printed substrates provide a distinctive tactile sensation.

The present invention provides a method of preparing a contoured plate comprising: providing a photopolymer printing plate which is selectively hardenable in a zone extending from its lower surface to a region intermediate the thickness of the plate on exposure of an upper surface of the plate to a controlled quantity of light energy; selectively hardening the photopolymer in a hardened zone which is adjacent the lower surface of the plate and which increases continuously in thickness from one portion of the plate to another, while leaving an upper unhardened zone of the photopolymer which continuously varies in depth above the hardened zone, by a first exposure of the upper surface of the plate to a quantity of light energy which increases continuously per unit area of the surface from said one portion to the other; terminating said first exposure; masking discrete portions of the upper surface of the plate whereon it is desired to form a recessed design; hardening the non-masked portions of the plate by a second exposure of its upper surface to light energy whereby the masked portions remain unhardened from the upper surface of the plate to the upper region of said hardened zone; terminating the second exposure; and removing the unhardened portions to provide a contoured design in the upper surface of the plate.

The process of the invention may employ known photopolymer printing plates. In their conventional usage, these plates are subjected to exposure to light (usually ultraviolet light) through a negative of the desired impression on a high contrast film, i.e. one bearing an image composed of substantially clear or transparent areas and the remainder of the film being of high density blackness.

Under the clear image areas, the polymer material of the plate is hardened from the upper surface downwardly through the thickness of the plate to a depth which is dependent on the type of plate employed, and is typically in the range 250 to 750 microns. The portions under the densely black areas remain soft or unhardened. Following the exposure, the plate is developed by removing the unhardened portions, typically by washing with water or other solvent for the unhardened polymer, leaving the hardened portions, which are relatively insoluble, and which correspond to the image, in relief standing above the lowermost portions of the plate by the above-mentioned dimension of 250 to 750 microns. The upper surfaces of the relief portions of the plate may then be employed for printing using, for example, lithographic or offset processes.

The applicant has found, however, that on exposure of such photopolymer plates to controlled quantities of light energy, the plate can be selectively hardened in a lower zone extending from its lower surface upwards to a region intermediate the thickness of the plate, leaving an upper portion of the thickness of the plate unhardened. Thus, by exposing the plate to controlled light energy varying from one portion of the plate to another in the quantity of light energy incident on a unit area of the surface of the plate, the plate can be hardened in a lower zone which varies continuously in thickness between these portions, the greater the light energy of the exposure, the thicker the hardened zone. This exposure is then terminated and the plate subjected to exposure through a high contrast positive film image of the desired image or is otherwise exposing it to light in a pattern corresponding to the desired image. The image is an image of the portions on which it is desired to form recesses in the final plate. The desired image may be, for example, an intaglio design, in the form of, for example, a pattern of lines or the like. The plate, in the exposed portions lying between the image portions, is hardened from its surface down to the zone hardened during the first exposure.

In the areas which are masked by the dark areas on the image, the polymer remains unhardened to a depth which is determined by the first exposure. On developing the plate by washing out or otherwise removing the unhardened areas, depressed portions of continuously varying depth are left in the plate, which may then be used directly or indirectly through further printing processing in intaglio printing to yield impressions of continuously varying thickness of deposited ink. The above process may also be used for forming a contoured plate for use as a master from which mouldings may be taken for preparing relief plaques or the like, for example as generally described in U.S. Pat. No. 4,668,607 in the name of M.S. Wojcik dated May 26, 1987.

The mechanism which results in the selective lower zone hardening of the plate while leaving the upper portion unhardened is not as yet completely understood. Without wishing to be bound by any theory, it is suggested that, at certain light energy levels, hardening of the photo-hardenable polymeric material of the plate is dependent on light reflected at the lower surface of the plate as well as on incident light. The reflected light may tend to be extinguished as a result of its absorption within the polymeric material before it reaches the upper portions of the plate.

The suitability of a given photopolymer plate for selective lower zone hardening and the range of light energy levels over which the desired selective lower zone hardening can be achieved can be readily determined in practice using the well known grey scales or step guides, which typically consist of a strip of film bearing a series of squares or other areas of progressively increasing density, usually ranging from relatively clear or transparent, through progressively darker grey tones to dense black. One such grey scale useful for the purpose comprises the Stouffer (trade mark) 21 step guide available from Stouffer Graphic Arts Equipment Company of South Bend, Ind. 46617, United States of America. In the testing procedure, a series of exposures of varying duration are made of test portions of the plate to be investigated, and the test portions are developed in the normal manner in order to remove unhardened portions. Plates and exposures which exhibit selective lower zone hardening will be indicated by the developed plates having progressively more depressed areas adjacent one another in the upper surfaces of the plates which areas will be visible to the eye or can be felt on rubbing the fingertip over the surface of the plate.

The above test procedure provides an indication of the quantity of light energy which needs to be applied per unit area of the plate in order to achieve selective lower zone hardening of the plate. Controlled variation of the total quantity of light incident on the plate per unit area around the value or values which are found to yield the desired lower zone hardening then allows controlled variation of the thickness of the hardened zone and thus of the depth of the interface between the hardened and unhardened portions of the plate. This interface subsequently determines the depth of the bottom of the grooves or other depressed portions formed on development of the plate after the second exposure.

Control of the quantity of light energy incident in a given area of the plate can be achieved in various manners. By way of example, a shutter may be interposed between the plate and a light source which irradiates the area of the upper surface of the plate with light of substantially uniform intensity, the shutter being progressively withdrawn across the plate after which the exposure is terminated, or the shutter being progressively interposed between the source and the plate, the areas which are first uncovered by the shutter in the former method or which are last to be covered by the shutter in the latter method receiving a greater quantity of light energy, while the remaining portions receive quantities of light energy which vary continuously across the plate in the direction of travel of the shutter. In a preferred form, however the intensity of the light incident on the plate is varied so that the plate is exposed to light which varies continuously in intensity from one portion of the plate to another. Preferably, this is achieved by disposing adjacent the upper surface of the plate a film which may be termed a conditioning film carrying an image of artwork, the image having a light absorbing density which varies continuously from one portion of the plate to another. The artwork or image may comprise, for example, a portrait, a landscape, or like pictorial matter, or may comprise an image which is of a progressively darker tone from one edge to another or which increases or decreases progressively radially away from a point on the film. The plate can then be exposed through the conditioning film to a light source which is incident with substantially uniform intensity on all areas of the film, but because of the variation in absorption of different areas of the film, results in different areas of the plate having light of differing intensities incident on it.

In the preferred form, the conditioning film is a developed monochromatic photographic film (i.e. one sensitive to substantially only a single wavelength) which is well adapted to provide a continuously varying tonal image, and the film is arranged with the emulsion side facing toward the plate, in order to provide close registry between the image on the film and the plate. Most preferably, the film comprises an antihalation layer. For reasons that are not at present fully understood, exposure of the plate through a conditioning film comprising an antihalation layer avoids or reduces problems of the upper surface of the plate tending to harden during the first exposure, rendering it more difficult to form the desired intaglio depressions in the upper surface. For example, with the Miraclon (trade mark) photopolymer plates presently preferred by applicant, exposure of the plate to ultraviolet light sources directly, without interposing photographic film, tends to result in hardening of the upper surface of the plate, at least with light sources of the usual intensities.

In a modified form of the method, a barrier film is interposed between the conditioning film and the upper surface of the plate during the first exposure. The barrier film is clear at least in the portions which correspond to the portions which are masked in the second exposure step. The barrier film may be an entirely clear film, but preferably bears a high contrast image which is the reverse of the mask used in the second step. It has been found that the use of the barrier film avoids or reduces problems of stains on the emulsion of the photographic film preferably used as the conditioning film. Such stains can arise from droplets of moisture falling on the photographic emulsion, as a result for example of a worker sneezing or coughing while holding the film. The stain acts as a light absorber, resulting in formation of a raised point or bump on the final contoured plate, and leading to a light spot on the printed product in the case in which the plate is used as an intaglio printing plate. The barrier film mitigates the light absorbing effect of the stain and also serves to prevent transfer of moisture from the emulsion to the photopolymer plate.

The use of a mask which is the reverse of the mask used in the second exposure serves to increase the sharpness or definition of the final contours and hence of printed matter obtained from the intaglio plate.

Preferably, the photopolymer plate comprises or coloured backing, for example a specularly reflective metal sheet or foil, an adhesive layer bonding a backing such as metal sheet or foil to the plate, or a piece of white paper or card. Such backings reflect back through the lower zones of the plate the light which is incident on the upper surface and are found to facilitate induction of the desired selective lower zone hardening of the plate.

The invention will be more fully described, by way of example only, with reference to the accompanying drawings, wherein:

Referring to the drawings, wherein like reference numerals denote like parts, 11 is a small portion of a photopolymer printing plate. Although FIG. 1 shows a small square portion, it will be appreciated that the plate may be as large as desired.

Figure 1:
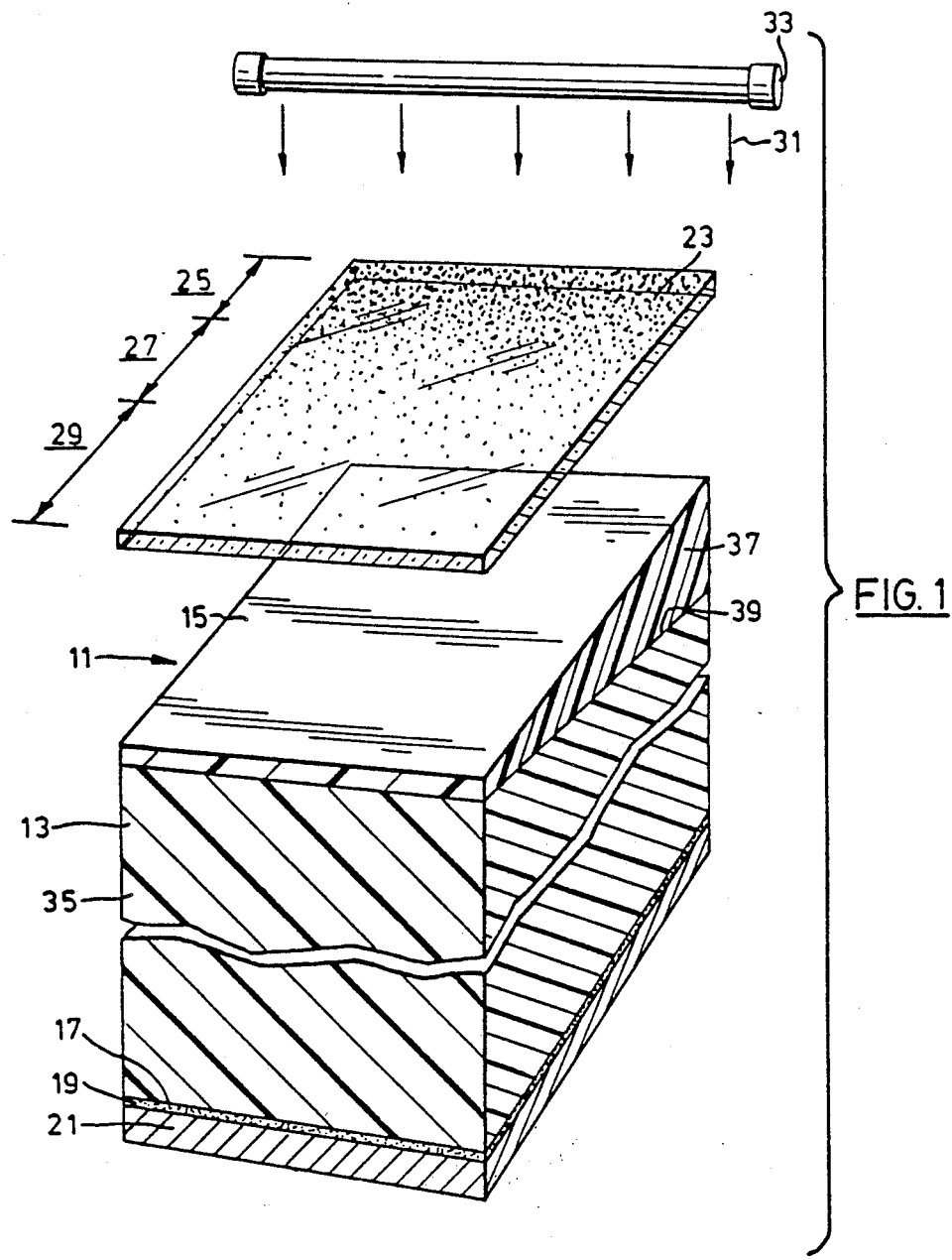
FIGS. 1, 2 and 3 are partially schematic partially perspective views of a small portion of a photopolymer plate in successive stages of a plate preparation process.

In order to show the components of the plate approximately to scale, the portion 11 is shown broken in its depth, but it will be appreciated that the photopolymer layer 13 will comprise a continuous layer, having an upper surface 15 and a lower surface 17, of depth about 250 to 750 microns. In the example shown, below the layer 13 is a thin adhesive layer 19, usually comprising a white or yellow-tinged adhesive, which is considered to reflect light incident on the upper surface 15 of the plate, and a backing 21 which is preferably a steel or aluminum plate.

Usually the layer 13,. as obtained from the manufacturer, has a protective film on its upper surface 15 which needs to be peeled off before the plate is used. Once the film is peeled off, standard precautions have to be taken to avoid fogging the plate by inadvertent exposure. For example, all work may be carried out under yellow light or other light to which the plate is insensitive, up to the point where the plate is finally fully developed.

A conditioning film 23 having tonal image of continuously varying density is applied to the upper surface 15 of the plate 11. For the sake of clarity of illustration, the drawings show films raised above the surface, but in practice the emulsion sides of the films should preferably be applied directly onto the upper surface 15, and preferably are vacuumed onto the upper surface 15. The density of the image on the film 23 varies continuously from a zone generally indicated at 25 through a medium grey zone 27 to a lighter or more transparent zone 29.

The upper surface of the plate 11 is exposed through the film 23 to ultraviolet light 31 from a source 33 such as a fluorescent tube or an array of tubes, and the quantity of light energy applied to the layer 13 is controlled so that a lower zone 35 of the layer is selectively hardened while an upper zone 37 is left unhardened. The thickness of the selectively hardened lower zone 35 increases from the area underlying the dense portion 25 of the image toward the area underlying the more transparent portion 29, so that an interface 39 between the hardened and unhardened zones slopes continuously downwardly from the area adjacent area 29 through area 25. The interface 39 is shown in the drawings purely as an aid to description, and is not visible in the plate in the course of the process.

In the preferred form, the densities of the image on the conditioning film 23 are selected so that with standard UV exposure apparatus, which generate light of a predetermined intensity, adequately long exposure times can be employed so that the full tonal range of the image can be reproduced in the form of a hardened lower zone 35 of continuously varying depth within the body of the plate. If the image contains areas which have too low an optical density, the exposure times on the exposure apparatus, at least with those generating the usual intensities of ultraviolet light, have to be made too short, and the full tonal range of the image on the film 23 is not reproduced. Preferably, therefore, the density of the image on the film 23 is in the range about 0.5 to about 2.5, more preferably in the range about 0.7 to about 2. As mentioned above, preferably the film 23 is a developed monochromatic photographic film containing an antihalation layer, and is applied to the upper surface 15 with its sensitive or emulsion side down.

After the desired period of exposure, the source 33 is extinguished and the conditioning film 23 is removed. A high contrast film 41 is applied to the upper surface 15, comprising a high contrast positive image of the desired form of impression. In the case in which the plate is to be used for intaglio printing the image will provide intaglio ink receptacles in the plate, and may, for example, consist of a pattern of lines. In the example illustrated, the image comprises a black line 43 and small black parallelograms 45 separated by clear areas 47 such as in a conventional lathe pattern.

Figure 2:
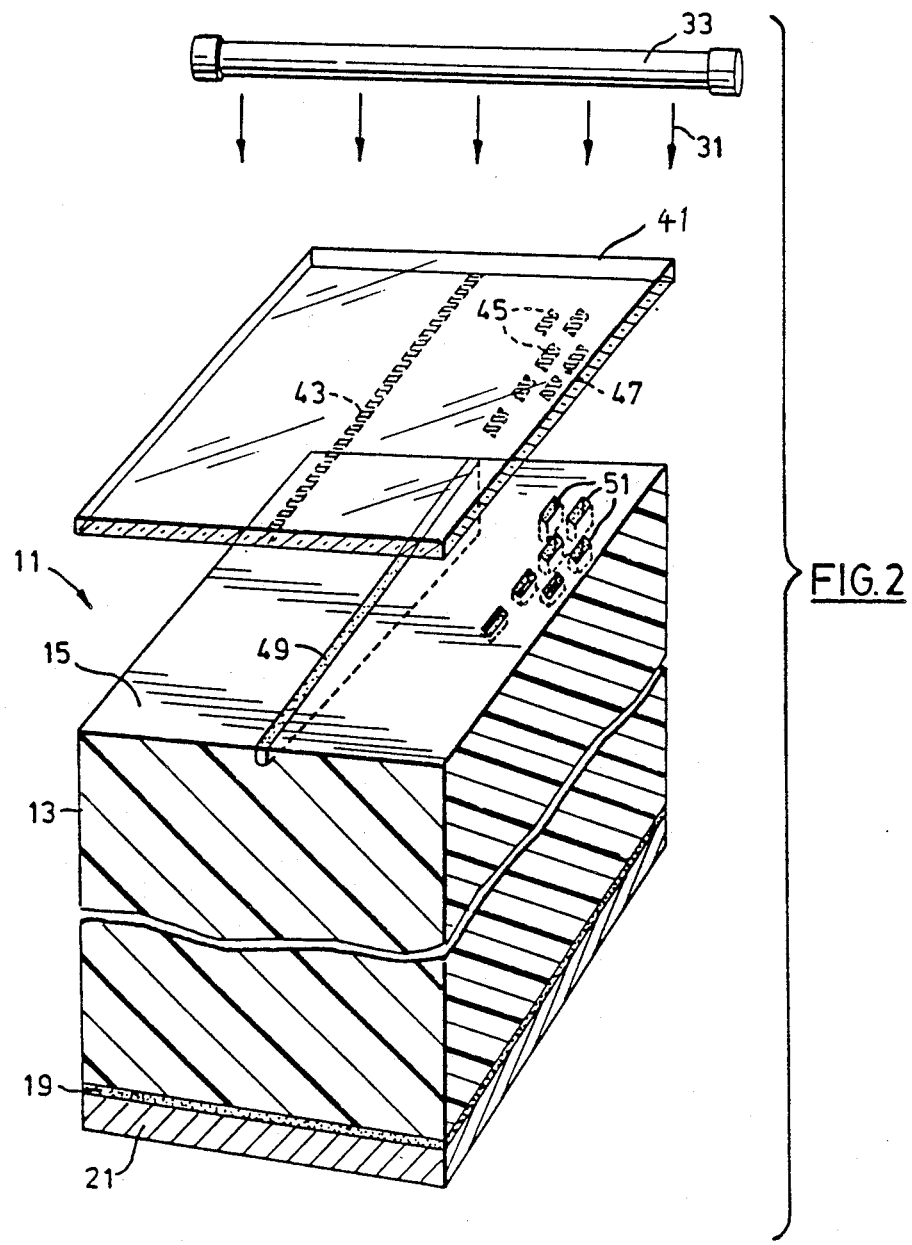

The plate is exposed through the film 41 from the source 33, the light causing the unhardened portion 37 to harden except in the areas 49 and 51 underlying the black areas 43 and 45, respectively. In these areas, the polymer resins unhardened down to the depth of the formerly hardened zone 35. As a result, the depth of the unhardened portions 49 and 51 increases continuously toward the rear of the plate as seen in FIG. 2.

Figure 4:
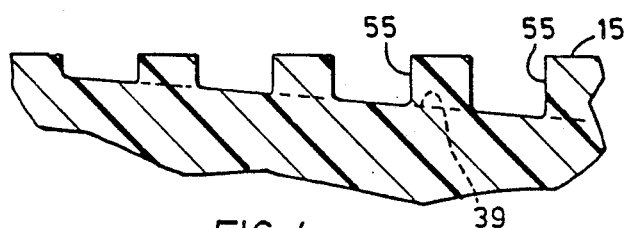
FIG. 4 is a cross section taken on the line IV—IV in FIG. 3.

On developing the plate, to develop out the unhardened portions, there is produced a groove 53 and discrete depressions 55 corresponding in area to the images 43 and 45, but increasing continuously in depth along a contour corresponding to the former interface 39 as seen in FIG. 4.

Figure 3:
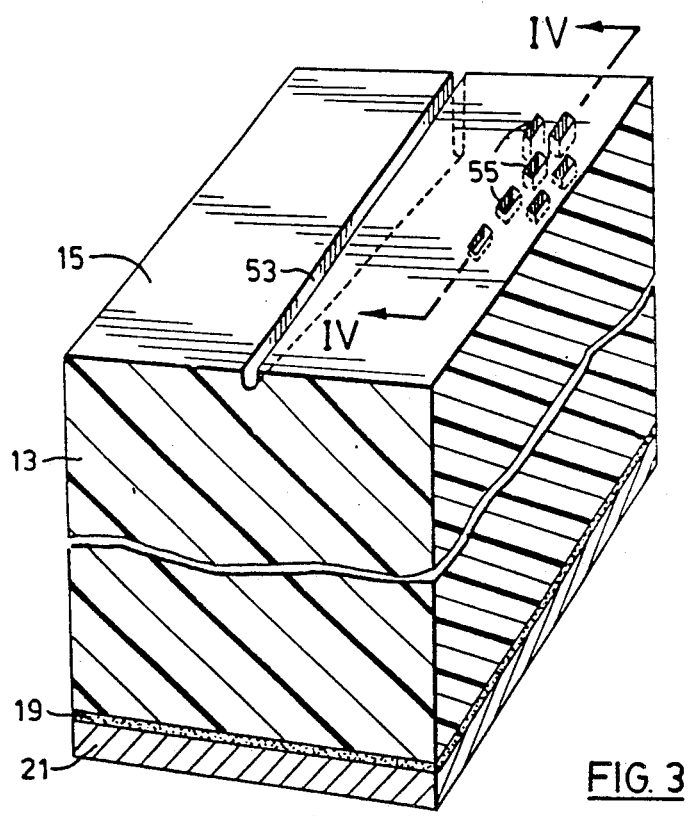

The developed plate of FIG. 3 may, if desired, be subjected to a final exposure to finally harden up the plate. It can then be used directly for intaglio printing wherein intaglio ink is placed in the groove 53 or depression 55, excess is wiped off the surface 15, and a substrate nd the surface 15 are brought together with sufficient pressure to transfer the ink out of the intaglio process in the plate onto the substrate.

Figure 5:
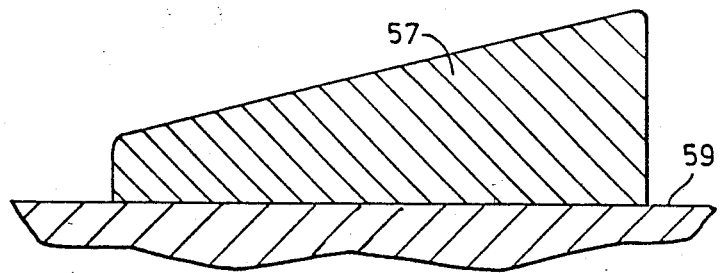
FIG. 5 shows schematically a cross section through a printed impression obtained with a plate prepared in accordance with the present process.

FIG. 5 shows somewhat schematically a profile of the ink impression 57 obtained from groove 53 on a substrate 59. As will be appreciated, the line 43 and hence groove 53 and impressions 57 may be of constant width, but of continuously varying depth.

It has been found that, using conventional plates and exposure apparatus, the grooves, depressions or other intaglio recesses are formed to a depth of no greater than about 100 microns. If necessary, however the depth of the interface 39 and hence the depth of the recesses formed on development of the plate may be controlled so that they do not exceed about 150 microns, more preferably about 100 microns, still more preferably about 75 mIcrons, which is favourable for complete emptying of the intaglio recesses in. printing. SuCh control can be effected by reduction of the exposure time wor of the intensity of the source 33. Because the photopolymer plate hardens to form shoulders which intrude laterally slightly inwardly below the image, e.g. the image 43 or 45, in the second exposure step, the bottom corners of the grooves, depressions or other intaglio recesses tend to be slightly rounded, as is seen in FIGS. 3 and 4, which is again favourable for transferring the intaglio ink completely out of the intaglio recesses in the printing process.

Instead of using the hardened plate 13 directly for printing, a male (alto) mould may be formed of the intaglio (basso) surface 15 using conventional moulding techniques and materials, and then a metal female may be formed from the mould using conventional techniques, e.g. galvanically. The metal female is then used as a printing surface.

Above there has been described a process in which the first or conditioning exposure (FIG. 1) uses a film with relatively simple continuously varying tonal image. It will be appreciated, however, that considerably more complex artwork may be employed, e.g. portraits, landscapes etc., or more complex abstract designs of continuously varying tonal quality. The second exposure may form the final basso with lathe patterns, lines, concentric circles and other intaglio patterns. With a lathe pattern, for example, a metameric effort, of the impression shading off into light tones can be achieved. The impression has a distinctive tactile feel.

Figure 6:
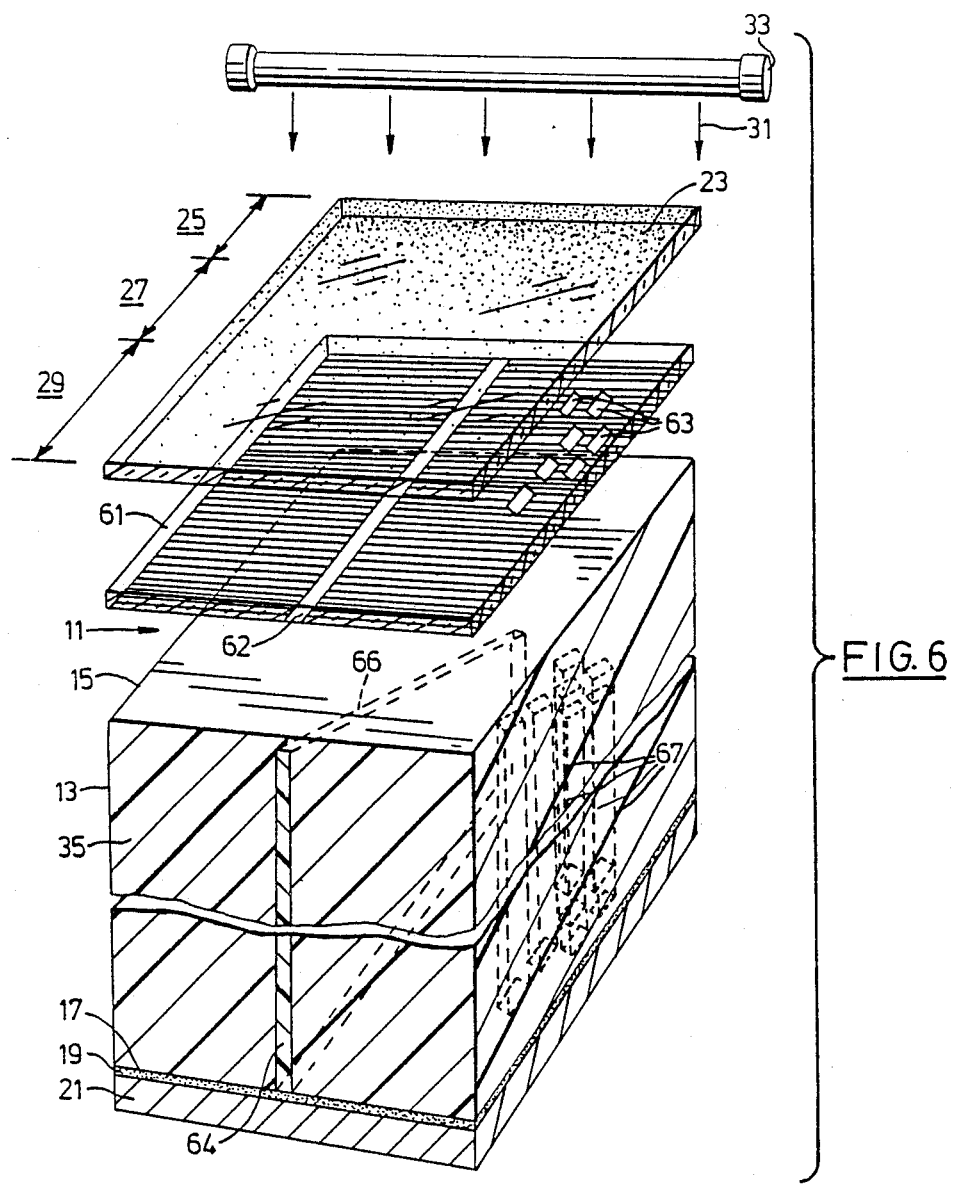
FIG. 6 shows schematically a first exposure stage of a modified form of the present method.

FIG. 6 illustrates a modified version of the method wherein, in the first or conditioning exposure, a barrier film 61 is interposed between the conditioning film 23 and the upper surface of the plate 11. The barrier film may be a clear plastic film compatible with the emulsion of the film 23 and with the photopolymer of the plate II, but is preferably a developed orthochromatic film bearing a high contrast image which is the reverse of the image on the high contrast film 41 used in the second exposure, that is, in the example shown, it has a clear line 62 and clear parallelograms 63 in the areas corresponding to black line 43 and parallelograms 45 of the film 41 of FIG. 2, the remainder of the film being densely black. The conditioning effect of the first exposure is therefore confined to the areas underneath the clear areas 62 and 63, resulting in a ridge 64 of hardened polymer within the matrix 13 of soft or unhardened polymer in the area below the clear line 62. The upper surface 66 of thin ridge inclines rearwardly downwardly in conformity to the bottom of the unhardened portion 49 remaining after the second exposure.

Similarly, below the clear areas 63, the polymer is hardened in columnar 67 portions, the tops of which coincide with the bottoms of the soft portions 51 remaining in FIG. 2.

Following the exposure illustrated in FIG. 6, the source 33 is extinguished, the films 23 and 61 removed, and the film 41 positioned over the plate. The procedure described above in detail with reference to FIGS. 2 to 5 is then followed.

Perfect registration is ensured between the clear areas of the reverse mask 61 and the mask 41 by techniques conventionally used in multiple masking operations. For example the films 23, 41 and 61 may be provided with pairs of punch holes allowing the films to be fitted precisely onto upstanding pins secured to a frame relative to which the plate 13 is held perfectly stationary during the exposures.

Although the above description provides ample information enabling the skilled reader to prepare printing plates in accordance with the invention, for the avoidance of doubt a detailed example will be given.

EXAMPLE

A Miraclon (trade mark) photopolymer printing plate sensitive to 550 to 430 nm, available from Tokyo Ohka Kogyo Co. Ltd., 403, Kosugi 1-chome, Nakahara-ku, Kawasaki, 211 Japan, was selected. The plate used was an MA-175 aluminium backed plate of 0.030 inch (750 microns) relief depth, 0.070 inch total thickness.

A negative was prepared photographically of a piece of continuously varying tonal artwork, using Kodak (trade mark) 4127 commercial film. A contact was then taken from the negative, using the same film, to get a positive, which varied continuously in density from 0.70 to 2.00.

Working under yellow light, the positive was placed emulsion side down on top of the Miraclon plate and the plate was exposed through the positive to ultraviolet light in vacuum in an N1000 Instant Mercury Printer available from NuArc Company Inc., Chicago, Ill., U.S.A., for 20 Camera Units (30 seconds). The positive was then removed from the plate.

A high contrast film positive of artwork such as radiating constant width lines, a lathe pattern or the like was prepared from the artwork using Fuji (trade mark) Contact Film KB 100, available from Fuji Photo Film Co. of Japan. The positive was applied emulsion side down to the plate and the plate was exposed through the positive under vacuum on the above-mentioned printer for 35 Camera Units (60 secs).

The film positive was removed and the plate was developed on a BASF Nyloprint developing machine, using a water wash for 2½ minutes at 85° F. and 60 psi. The plate was dried and post exposed on the above-mentioned printer for about 55 Camera Units or 2 minutes.

The plate could be used directly for intaglio printing, or a male could be moulded therefrom, and a metal female formed from the male mould, using normal intaglio printing practice, to provide a printing plate.

We claim:

1. Method of preparing a contoured plate comprising: providing a photopolymer printing plate which is selectively hardenable in a zone extending from its lower surface to a region intermediate the thickness of the plate on exposure of an upper surface of the plate to a controlled quantity of light energy; selectively hardening the photopolymer in a hardened zone which is adjacent the lower surface of the plate and which increases continuously in thickness from one portion of the plate to another, while leaving an upper unhardened zone of the photopolymer which continuously varies in depth above the hardened zone, by a first exposure of the upper surface of the plate to a quantity of light energy which increases continuously per unit area of the surface from said one portion to the other; terminating said first exposure; masking discrete portions of the upper surface of the plate whereon it is desired to form a recessed design; hardening the non-masked portions of the plate by a second exposure of its upper surface to light energy whereby the masked portions remain unhardened from the upper surface of the plate to the upper region of said hardened zone; terminating the second exposure; and removing the unhardened portions to provide a contoured design in the upper surface of the plate.

2. Method according to claim 1 wherein said first exposure comprises exposing the plate to light which varies continuously in intensity from said one portion to the other.

3. Method according to claim 2 wherein a conditioning film comprising an image of light absorbing density varying continuously from one portion to another is disposed adjacent the upper surface of the plate and the plate is exposed through the conditioning film to light incident with substantially uniform intensity on the film.

4. Method according to claim 3 wherein the density of the image on the conditioning film is in the range about 0.5 to about 2.5.

5. Method according to claim 4 wherein the density is in the range about 0.7 to about 2.

6. Method according to claim 3 wherein said conditioning film comprises a developed photographic film comprising an antihalation layer.

7. Method according to claim 3 wherein said conditioning film comprises a developed monochromatic photographic film.

8. Method according to claim 7 wherein the emulsion side of the conditioning film is applied to the plate.

9. Method according to claim 3 wherein in said first exposure a barrier film is interposed between the conditioning film and the upper surface of the plate, said barrier film being clear at least in portions corresponding to the portions which are masked in the second exposure.

10. Method according to claim 9 wherein the barrier film is a developed orthochromatic film bearing a high contrast image which is the reverse of the masked portions in the second exposure.

11. Method according to claim 1 wherein the depth of the interface between the hardened and non-hardened zones in the first exposure step varies up to about 150 microns below the upper surface of the plate.

12. Method according to claim 11 wherein said depth is up to about 100 microns.

13. Method according to claim 12 wherein said depth is up to about 75 microns.

14. Method according to claim 1 wherein the photopolymer plate has a reflective or light-coloured backing applied to its lower surface.

15. Method according to claim 14 wherein the plate comprises a reflective adhesive layer.

16. Method according to claim 1, including the further steps of making a male mould of the contoured design and making a metal female from the male mould.

17. Method according to claim 1 wherein said second exposure is conducted by applying to the plate a developed orthochromatic film bearing a high contrast image, and exposing the plate to a light source through said developed orthochromatic film.

18. Method according to claim 1 wherein said light energy is ultraviolet light energy.

19. Method according to claim 1 wherein the discrete masked portions of the upper surface of the plate define an intaglio design.

20. Method according to claim 19 wherein the intaglio design comprises elongated lines.

* * * * *